US012563952B2

(12) United States Patent
Ma et al.

(10) Patent No.: US 12,563,952 B2
(45) Date of Patent: Feb. 24, 2026

(54) DISPLAY DEVICE WITH ALIGNED OPENINGS IN A POLARIZING FILM AND CONDUCTIVE LAYERS AND METHOD OF MANUFACTURING THE SAME

(71) Applicant: Samsung Display Co., Ltd., Yongin-Si (KR)

(72) Inventors: Jin Seock Ma, Hwaseong-si (KR); Moosoon Ko, Seoul (KR); Donghoon Kim, Suwon-si (KR); Sanghoon Yim, Suwon-si (KR); Dongjo Kim, Suwon-si (KR); Youngji Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 802 days.

(21) Appl. No.: 17/872,904

(22) Filed: Jul. 25, 2022

(65) Prior Publication Data

US 2023/0030952 A1     Feb. 2, 2023

(30) Foreign Application Priority Data

Jul. 27, 2021     (KR) ........................ 10-2021-0098610

(51) Int. Cl.
H10K 59/80 (2023.01)
H10K 59/131 (2023.01)
H10K 59/65 (2023.01)

(52) U.S. Cl.
CPC ....... H10K 59/8791 (2023.02); H10K 59/131 (2023.02); *H10K 59/65* (2023.02)

(58) Field of Classification Search
CPC .. H10K 59/8791; H10K 59/131; H10K 59/65; H10K 71/00; H10K 50/856; H10K 50/868

(Continued)

(56) References Cited

U.S. PATENT DOCUMENTS 9,202,855 B1   12/2015   Jo et al.
10,460,147 B2 *  10/2019   Yang ..................... G06F 3/0412
(Continued)

FOREIGN PATENT DOCUMENTS

CN       110060642 A    7/2019
KR   10-2006-0055052 A    5/2006
(Continued)

OTHER PUBLICATIONS

Korean Notice of Allowance corresponding to Application No. 10-2021-0098610 and issued on Apr. 22, 2025, 7 pages.

*Primary Examiner* — Eric W Jones
(74) *Attorney, Agent, or Firm* — Innovation Counsel LLP

(57)                ABSTRACT

A display device includes a substrate having a first area and a second area, wherein the first area includes a transmissive area and a non-transmissive area adjacent to the transmissive area and the second area has transmittance less than the first area, a display portion disposed in the non-transmissive area of the first area and the second area and disposed on the substrate, a conductive layer disposed between the substrate and the display portion and defining a plurality of first openings overlapping the transmissive area, a low reflection layer disposed between the substrate and the conductive layer, overlapping the conductive layer, and defining a plurality of second openings overlapping the transmissive area and a polarizing film disposed under the substrate, overlapping the conductive layer, and defining a plurality of third openings overlapping the transmissive area.

18 Claims, 12 Drawing Sheets

(58) Field of Classification Search
    USPC .............................................. 257/40, 59, 99
    See application file for complete search history.

(56)                    References Cited

U.S. PATENT DOCUMENTS

| | | | |
|---|---|---|---|
| 10,839,755 | B2 | 11/2020 | Ha et al. |
| 2014/0009702 | A1 | 1/2014 | Kim et al. |
| 2014/0043683 | A1 | 2/2014 | Jo et al. |
| 2016/0195653 | A1* | 7/2016 | Lee ........................ G02B 5/305 |
| | | | 427/163.1 |
| 2016/0260668 | A1* | 9/2016 | Harada ................... H01L 24/05 |
| 2016/0282194 | A1* | 9/2016 | Barnett ................. H10N 10/01 |
| 2019/0165074 | A1 | 5/2019 | Lee et al. |
| 2020/0236259 | A1* | 7/2020 | Nakamura ........... H10K 50/844 |
| 2020/0301187 | A1* | 9/2020 | Lin ........................ G02B 5/008 |
| 2021/0109278 | A1* | 4/2021 | Peroz .................. G02B 6/0016 |
| 2022/0037419 | A1 | 2/2022 | Ma et al. |
| 2022/0147186 | A1* | 5/2022 | Bo ..................... G02F 1/13338 |

FOREIGN PATENT DOCUMENTS

| | | | |
|---|---|---|---|
| KR | 10-2014-0005508 | A | 1/2014 |
| KR | 10-2014-0020095 | A | 2/2014 |
| KR | 10-2016-0021342 | A | 2/2016 |
| KR | 10-2019-0064701 | A | 6/2019 |

* cited by examiner

DISPLAY DEVICE WITH ALIGNED OPENINGS IN A POLARIZING FILM AND CONDUCTIVE LAYERS AND METHOD OF MANUFACTURING THE SAME

CROSS-REFERENCE TO RELATED APPLICATION(S)

This application claims priority under 35 USC § 119 to Korean Patent Application No. 10-2021-0098610 filed on Jul. 27, 2021 in the Korean Intellectual Property Office (KIPO), the entire disclosure of which is incorporated by reference herein.

BACKGROUND

1. Field

The present disclosure generally relates to a display device and a method of manufacturing the same. More particularly, the present disclosure relates to a display device capable of reducing reflection of external light and a method for manufacturing the same.

2. Description of the Related Art

The display device may provide visual information to a user as displaying an image. Accordingly, the display device may include a display panel that converts an electrical signal into the image. The display panel may include a transmissive area that transmits external light incident on the display device. A functional module disposed under the display panel may sense or recognize an object, a user, etc. positioned in front of the display panel through the transmissive area.

When the external light passes through the transmissive area having a relatively small area and is incident on the functional module, light interference may occur. In addition, when the interfered external light is reflected by the display panel and/or the functional module, the user may view a ghost image or the like in the transmissive area.

SUMMARY

Embodiments provide a display device in which reflection of external light is reduced.

Other embodiments provide a method of manufacturing the display device.

A display device according to an embodiment may include a substrate including a first area and a second area, wherein the first area includes a transmissive area and a non-transmissive area disposed adjacent to the transmissive area and the second area has transmittance less than the first area, a display portion disposed in the non-transmissive area of the first area and the second area and disposed on the substrate, a conductive layer disposed between the substrate and the display portion and defining a plurality of first openings overlapping the transmissive area, a low reflection layer disposed between the substrate and the conductive layer, overlapping the conductive layer, and defining a plurality of second openings overlapping the transmissive area and a polarizing film disposed under the substrate, overlapping the conductive layer, and defining a plurality of third openings overlapping the transmissive area.

In an embodiment, in a plan view, each of the first openings and each of the second openings may overlap each other, and each of the first openings and each of the third openings may overlap each other.

In an embodiment, in a plan view, an area of each of the third openings may be less than or equal to an area of each of the first openings.

In an embodiment, each of the first openings and each of the second openings may have a same shape.

In an embodiment, the conductive layer may include a plurality of unit patterns arranged in a matrix form and a plurality of bridge patterns connecting the unit patterns.

In an embodiment, each of the first openings may be defined by the unit patterns and the bridge patterns.

In an embodiment, the low reflection layer may include amorphous silicon, silicon oxide, or a mixture thereof.

In an embodiment, a reflectance of the polarizing film may be less than a reflectance of the conductive layer.

In an embodiment, the display device may further include a functional module disposed under the substrate and the polarizing film and overlapping the first area.

In an embodiment, the display portion may include a transistor disposed on the conductive layer and a light emitting diode electrically connected to the transistor.

In an embodiment, the transistor and the light emitting diode may overlap the non-transmissive area of the first area and the second area and may not overlap the transmissive area.

A display device according to an embodiment may include a substrate including a first area and a second area, wherein the first area includes a transmissive area and a non-transmissive area disposed adjacent to the transmissive area and the second area has a transmittance less than a transmittance of the first area, a display portion disposed in the non-transmissive area of the first area and the second area and disposed on the substrate, a conductive layer disposed between the substrate and the display portion, overlapping the non-transmissive area of the first area and the second area, and defining a plurality of first openings overlapping the transmissive area, a low reflection layer disposed between the substrate and the conductive layer, overlapping the conductive layer, and defining a plurality of second openings, wherein each of the second openings overlaps each of the first openings and has the same shape as each of the first openings and a polarizing film disposed under the substrate, overlapping the conductive layer, and defining a plurality of third openings, wherein each of the third openings overlaps each of the first openings and has an area less than or equal to an area of each of the first openings.

In an embodiment, the conductive layer may include a plurality of unit patterns arranged in a matrix form and a plurality of bridge patterns connected the unit patterns.

In an embodiment, each of the first openings may be defined by the unit patterns and the bridge patterns.

A method of manufacturing a display device according to an embodiment may include steps of forming a low reflection layer on a substrate, wherein the substrate includes a first area including a transmissive area and a non-transmissive area disposed adjacent to the transmissive area, and a second area having a transmittance less than transmittance of the first area, forming a conductive layer on the low reflection layer, forming a plurality of openings by patterning a portion of the conductive layer overlapping the transmissive area, forming a plurality of second openings by patterning a portion of the low reflection layer overlapping the transmissive area, forming a display portion on the conductive layer, forming a polarizing film under the substrate and forming a plurality of third openings in the polarizing film, wherein each of the third openings overlaps each of the first openings.

In an embodiment, the polarizing film may overlap the conductive layer.

In an embodiment, in a plan view, an area of each of the third openings may be less than or equal to an area of each of the first openings.

In an embodiment, the first openings and the second openings may be formed simultaneously.

In an embodiment, each of the first openings and each of the second openings may have a same shape.

In an embodiment, the third openings may be formed by irradiating a laser to the polarizing film.

As a display device according to an embodiment of the disclosure includes a first area including a transmissive area and a non-transmissive area, and includes a low reflection layer and a polarizing film overlapping the conductive layer under the conductive layer disposed in the non-transmissive area, reflection of external light passing through the first area may be reduced or substantially prevented. Accordingly, a ghost image due to interference and reflection of the external light in the first area may not be visually recognized.

BRIEF DESCRIPTION OF THE DRAWINGS

FIGS. 7, 8, 9, 10, 11, 12, and 13 are cross-sectional views illustrating a method of manufacturing a display device according to an embodiment.

DETAILED DESCRIPTION OF THE EMBODIMENTS

Figure 1:
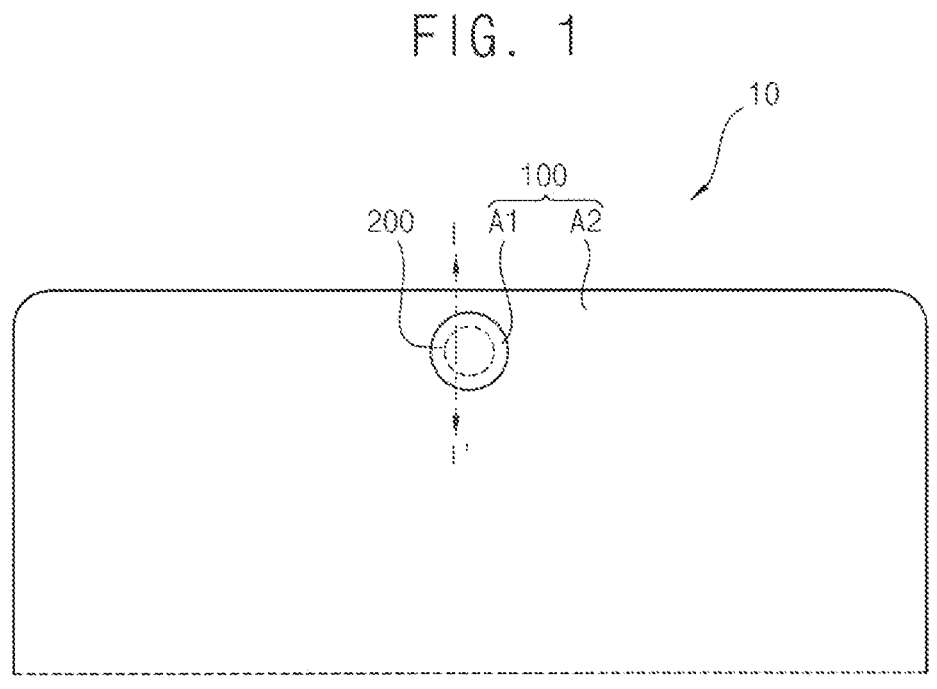
FIG. 1 is a plan view illustrating a portion of a display device according to an embodiment.

Hereinafter, display devices in accordance with embodiments will be described in more detail with reference to the accompanying drawings. The same reference numerals are used for the same components in the drawings, and redundant descriptions of the same components will be omitted.

Figure 2:
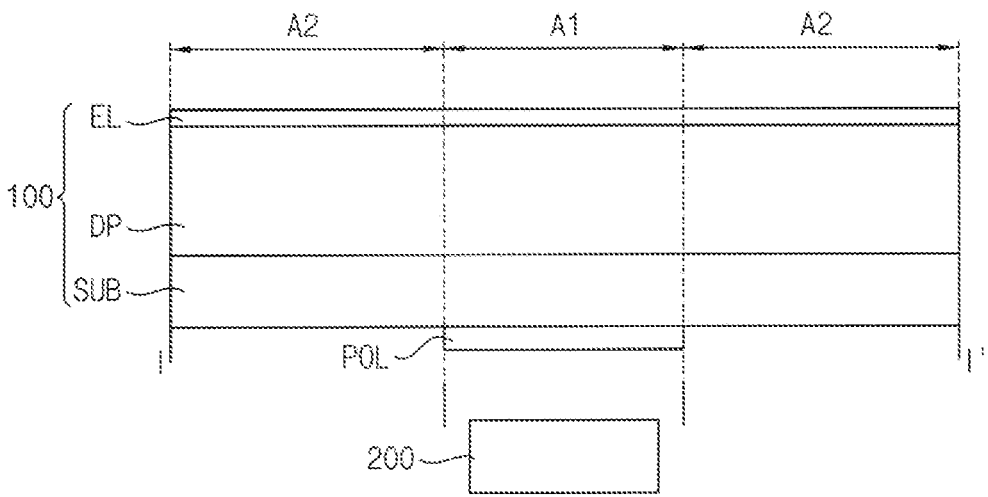
FIG. 2 is a cross-sectional view illustrating an example taken along line I-I' of FIG. 1.

FIG. 1 is a plan view illustrating a portion of a display device according to an embodiment. FIG. 2 is a cross-sectional view illustrating an example taken along line I-I' of FIG. 1.

Referring to FIGS. 1 and 2, the display device 10 may include a display panel 100, a polarizing film POL, and a functional module 200.

The display panel 100 may include a first area A1 and a second area A2. Each of the first area A1 and the second area A2 may be a display area for displaying a moving or stationary image. The first area A1 may include a transmissive area which transmits external light and a non-transmissive area which surrounds the transmissive area. The first area A1 may transmit the external light incident on the first area A1 while displaying the image.

The first area A1 and the second area A2 may be located adjacent to each other. In an embodiment, the second area A2 may surround at least a portion of the first area A1. For example, the first area A1 may be spaced apart from an edge of the display panel 100 in a plan view and disposed in the display panel 100, and the second area A2 may surround entirety of the first area A1.

In an embodiment, the first area A1 may have a circular planar shape. However, the disclosure is not limited thereto, and the first area A1 may have various polygonal planar shapes.

The display panel 100 may include a substrate SUB, a display portion DP, a conductive layer (e.g., a conductive layer CP of FIGS. 3 and 4), a low reflection layer (e.g., a low reflection layer LRL), and an encapsulation layer EL. As the display panel 100 includes the first area A1 and the second area A2, the substrate SUB may also include the first area A1 and the second area A2. The display portion DP may be disposed on the substrate SUB. The display portion DP may include pixels for displaying an image. The pixels may include a transistor and a light emitting diode connected to the transistor. The conductive layer may be disposed between the substrate SUB and the display unit DP. The low reflection layer may be disposed between the substrate SUB and the conductive layer.

The polarizing film POL may be disposed under the substrate SUB. In an embodiment, the polarizing film POL may partially overlap the first area A1. For example, the polarizing film POL may be disposed to overlap only the non-transmissive area of the first area A1. However, the present disclosure is not limited thereto, and the polarizing film POL may overlap the first area A1 and the second area A2.

The functional module 200 may be disposed under the display panel 100 corresponding to the first area A1. In an embodiment, the functional module 200 may be disposed under the polarizing film POL in the first area A1. The functional module 200 may receive external light passing through the first area A1.

In an embodiment, examples of the functional module 200 include a camera module, a face recognition sensor module, a pupil recognition sensor module, an acceleration sensor module, a geomagnetic sensor module, a proximity sensor module, an infrared sensor module, and an illuminance sensor module. The camera module may be a module that captures (or recognizes) an image of an object positioned in front of the display device. The face recognition sensor module may be a module for detecting a user's face. The pupil recognition sensor module may be a module for detecting a user's pupil. The acceleration sensor module and the geomagnetic sensor module may be modules for determining a movement of the display device. The proximity sensor module and the infrared sensor module may be modules for detecting whether a front surface of the display device is in proximity. The illuminance sensor module may be a module for measuring a degree of external brightness.

Figure 3:
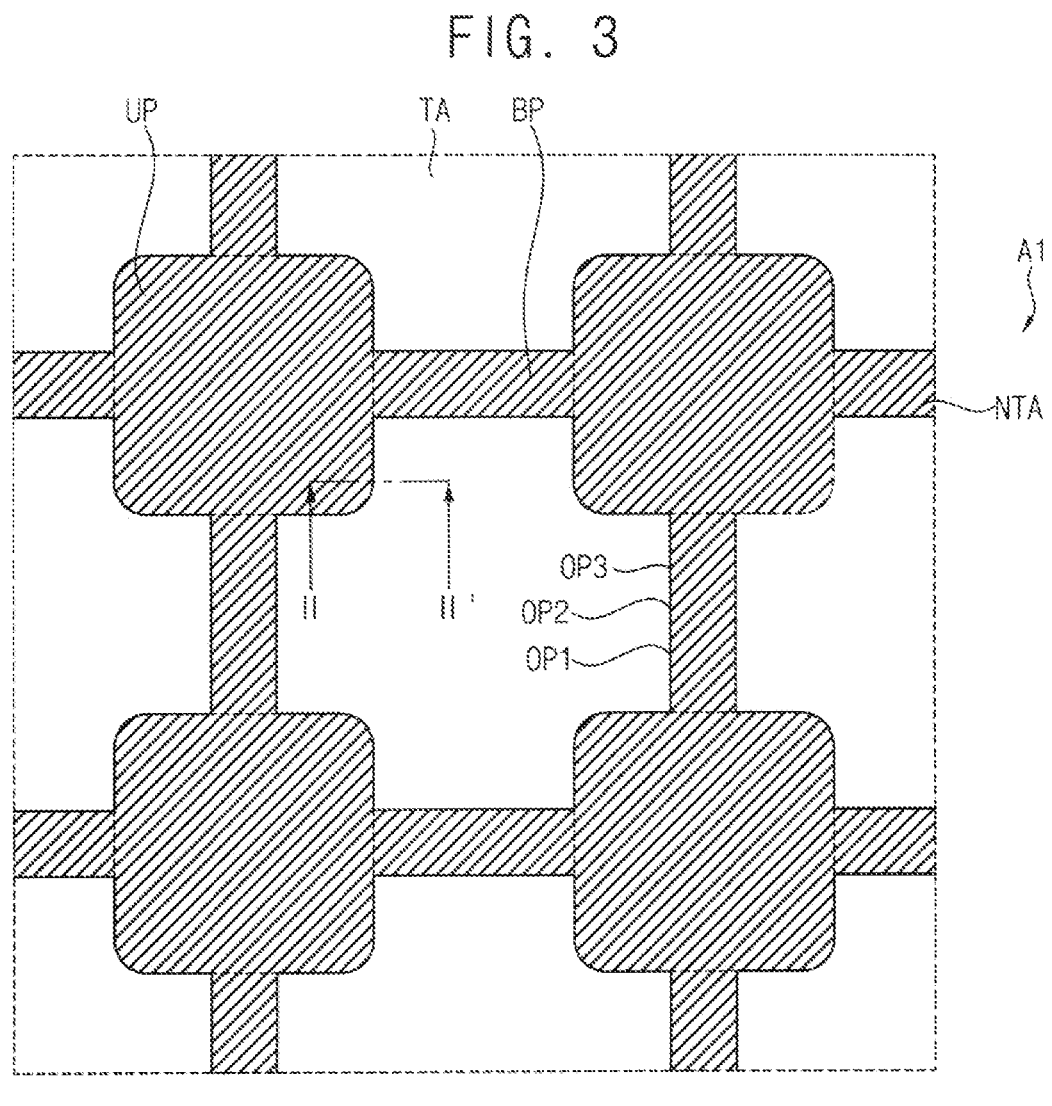
FIG. 3 is a plan view illustrating an example of a first area included in the display device according to an embodiment of the disclosure of FIG. 1.

FIG. 3 is a plan view illustrating an example of a first area included in the display device according to an embodiment of the present disclosure of FIG. 1.

Referring to FIGS. 1, 2, and 3, the first area A1 may include a transmissive area TA and a non-transmissive area NTA. The non-transmissive area NTA may be adjacent to the transmissive area TA. For example, the transmissive area TA may be an area in which the conductive layer CP is not disposed, and the non-transmissive area NTA may be an area in which the conductive layer CP is disposed. Accordingly, an arrangement relationship and area of the transmissive area TA and the non-transmissive area NTA may vary according to a shape of the conductive layer CP.

The transmissive area TA may be an area through which external light incident on the display device 10 is transmitted. Since the first area A1 includes the transmissive area TA through which external light is transmitted, the functional module 200 disposed under the display panel 100 corresponding to the first area A1 may sense or recognize an object or a user positioned in front of the display device 10 through the transmissive area TA.

The non-transmissive area NTA may be an area in which light generated from the display portion DP is emitted. The display portion DP may include a plurality of pixels. Also, the pixels may include a plurality of sub-pixels emitting light of different colors from each other. For example, the sub-pixels may include a red sub-pixel emitting red light, a green sub-pixel emitting green light, and a blue sub-pixel emitting blue light. For example, the sub-pixels may be arranged in a stripe manner or in a Pentile™ manner.

As the first area A1 includes the transmissive area TA, the number of sub-pixels per unit area of the first area A1 may be less than the number of sub-pixels per unit area of the second area A2. In other words, a resolution of the first area A1 may be less than a resolution of the second area A2.

In an embodiment, as the first area A1 includes the transmissive area TA, a transmittance of the first area A1 may be higher than that of the second area A2. In other words, a transmittance of the second area A2 may be lower than that of the first area A1.

In an embodiment, the conductive layer CP may be disposed on the substrate SUB corresponding to the non-transmissive area NTA. The conductive layer CP may overlap the non-transmissive area NTA and may not overlap the transmissive area TA.

In an embodiment, the conductive layer CP may include a plurality of unit patterns UP and a plurality of bridge patterns BP connecting the unit patterns UP. The plurality of unit patterns UP may be arranged in various ways. For example, the plurality of unit patterns UP may be arranged in a matrix form.

In an embodiment, first openings OP1 may be formed in the conductive layer CP. For example, the first openings OP1 may be defined by the unit patterns UP and the bridge patterns BP. The first openings OP1 may overlap the transmissive area TA.

As the first openings OP1 are formed in the conductive layer CP, the transmissive area TA may be defined. That is, external light may pass through the transmissive area TA due to the first openings OP1.

In an embodiment, the low reflection layer may be disposed under the conductive layer CP. The low reflection layer may overlap the conductive layer CP. For example, a shape of the low reflection layer may be the same as that of the conductive layer CP. However, embodiments according to the disclosure may not be limited thereto.

As the shape of the low reflection layer is the same as that of the conductive layer CP, the low reflection layer may overlap the non-transmissive area NTA and may not overlap the transmissive area TA. Also, the low reflection layer may include a plurality of unit patterns and a plurality of bridge patterns connecting the unit patterns.

Second openings OP2 may be formed in the low reflection layer. For example, the second openings OP2 may be defined by the unit patterns and the bridge patterns included in the low reflection layer. Each of the second openings OP2 may overlap each of the first openings OP1, and may have the same shape as each of the first openings OP1. The second openings OP2 may overlap the transmissive area TA.

In an embodiment, the polarizing film POL may be disposed under the substrate SUB. The polarizing film POL may overlap the conductive layer CP. A shape of the polarizing film POL may be the same as that of the conductive layer CP. An area of the polarizing film POL may be the same as an area of the conductive layer CP. That is, the polarizing film POL may entirely overlap the conductive layer CP. Accordingly, the polarizing film POL may overlap the non-transmissive area NTA. Also, the polarizing film POL may include a plurality of unit patterns and bridge patterns connecting the unit patterns.

Third openings OP3 may be formed in the polarizing film POL. For example, the third openings OP3 may be defined by the unit patterns and the bridge patterns included in the polarizing film POL. Each the third openings OP3 may overlap each of the first openings OP1. For example, the area of the polarizing film POL may be the same as the area of the conductive layer CP. In this case, the area of each of the third openings OP3 may be substantially the same as the area of each of the first openings OP1.

Figure 4:
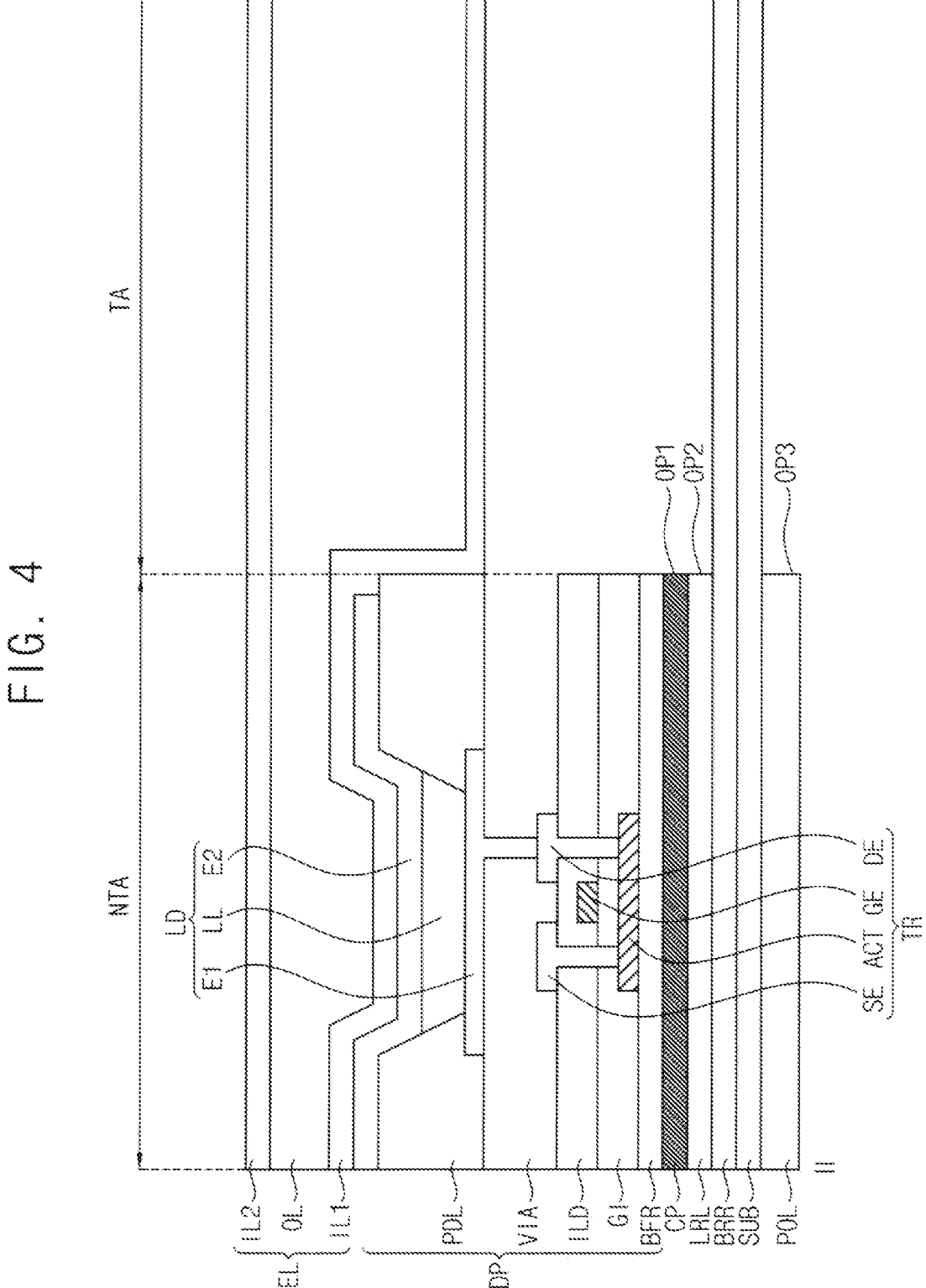
FIG. 4 is a cross-sectional view taken along line II-II' of FIG. 3.

FIG. 4 is a cross-sectional view taken along line II-II' of FIG. 3.

Referring to FIGS. 1, 2, 3, and 4, the display panel 100 may include the substrate SUB, the barrier layer BRR, the low reflection layer LRL, the conductive layer CP, the display portion DP, and an encapsulation layer EL. The display portion DP may include a buffer layer BFR, a gate insulating layer GI, an interlayer insulating layer ILD, a transistor TR, a via insulating layer VIA, a pixel defining layer PDL, and a light emitting diode LD. The transistor TR may include an active layer ACT, a source electrode SE, a gate electrode GE, and a drain electrode DE. The light emitting diode LD may include a first electrode E1, a light emitting layer LL, and a second electrode E2. The encapsulation layer EL may include a first inorganic encapsulation layer IL1, an organic encapsulation layer OL, and a second inorganic encapsulation layer IL2.

The substrate SUB may include a transparent material or an opaque material. Examples of the material constituting the substrate SUB may include plastic, polyethersulfone, polyacrylate, polyetherimide, polyarylate, polyimide, etc. The above materials may be used alone or in combination. However, the material forming the substrate SUB is not limited thereto, and the substrate SUB may include a glass material including silicon.

The barrier layer BRR may be disposed on the substrate SUB. The barrier layer BRR may prevent foreign substances from penetrating under the substrate SUB. Examples of the material forming the barrier layer BRR may include silicon oxide, silicon nitride, silicon oxynitride, etc. The above materials may be used alone or in combination.

In the non-transmissive area NTA, the low reflection layer LRL may be disposed on the barrier layer BRR. In an embodiment, the low reflection layer LRL may include amorphous silicon, silicon, or a mixture thereof. The low reflection layer LRL may prevent external light from reaching the conductive layer CP. A reflectance of the low reflection layer LRL may be less than that of the conductive layer CP.

In the non-transmissive area NTA, the conductive layer CP may be disposed on the low reflection layer LRL. The conductive layer CP may block external light incident from the outside of the display device 10. For example, the conductive layer CP may include a metal material having low light transmittance.

The conductive layer CP may include a conductive material. For example, examples of the conductive material forming the conductive layer CP may include aluminum, platinum, palladium, silver, magnesium, gold, nickel, neodymium, iridium, chromium, lithium, calcium, molybdenum, titanium, tungsten, copper, etc. The above materials may be used alone or in combination. Preferably, the conductive layer CP may include molybdenum (Mo).

In the non-transmissive area NTA, the buffer layer BFR may be disposed on the conductive layer CP. The buffer layer BFR may cover the conductive layer CP. The buffer layer BFR may prevent penetration of foreign substances from the conductive layer CP. Examples of the material forming the buffer layer BFR may include silicon oxide, silicon nitride, silicon oxynitride, etc. The above materials may be used alone or in combination.

In the non-transmissive area NTA, an active layer ACT may be disposed on the buffer layer BFR. The active layer ACT may include a semiconductor material. For example, the active layer ACT may include a silicon-based semiconductor material. Alternatively, the active layer ACT may include an oxide-based semiconductor material.

In the non-transmissive area NTA, the gate insulating layer GI may be disposed on the buffer layer BFR. The gate insulating layer GI may cover the active layer ACT. The gate insulating layer GI may insulate the active layer ACT from the gate electrode GE. The gate insulating layer GI may include an inorganic insulating material. For example, the gate insulating layer GI may include silicon oxide, silicon nitride, silicon oxynitride, etc.

In the non-transmissive area NTA, the gate electrode GE may be disposed on the gate insulating layer GI. The gate electrode GE may be disposed to overlap the active layer ACT. The gate electrode GE may include a conductive material. For example, examples of the conductive material forming the gate electrode GE may include aluminum, platinum, palladium, silver, magnesium, gold, nickel, neodymium, iridium, chromium, lithium, calcium, molybdenum, titanium, tungsten, copper, etc. The above materials may be used alone or in combination. When an electric signal is applied to the gate electrode GE, the source electrode SE and the drain electrode DE may be electrically connected.

In the non-transmissive area NTA, the interlayer insulating layer ILD may be disposed on the gate insulating layer GI. The interlayer insulating layer ILD may cover the gate electrode GE. The interlayer insulating layer ILD may insulate the gate electrode GE from the source electrode SE. Also, the interlayer insulating layer ILD may insulate the gate electrode GE from the drain electrode DE. The interlayer insulating layer ILD may include an inorganic insulating material. For example, examples of the inorganic insulating material forming the interlayer insulating layer ILD may include silicon oxide, silicon nitride, and silicon oxynitride. The above materials may be used alone or in combination.

In the non-transmissive area NTA, the source electrode SE and the drain electrode DE may be disposed on the interlayer insulating layer ILD. The source electrode SE and the drain electrode DE may contact the active layer ACT. For example, the source electrode SE may contact one portion of the active layer ACT through a contact hole penetrating the interlayer insulating layer ILD and the gate insulating layer GI. For example, the drain electrode DE may contact the other portion of the active layer ACT through a contact hole penetrating the interlayer insulating layer ILD and the gate insulating layer GI. Each of the source electrode SE and the drain electrode DE may include a conductive material. For example, examples of the conductive material forming the source electrode SE and the drain electrode DE may include aluminum, platinum, palladium, silver, magnesium, gold, nickel, neodymium, iridium, chromium, lithium, calcium, molybdenum, titanium, tungsten, copper, etc. The above materials may be used alone or in combination.

In the non-transmissive area NTA and the transmissive area TA the via insulating layer VIA may be disposed. Specifically, in the non-transmissive area NTA, the via insulating layer VIA may be disposed on the interlayer insulating layer ILD. In the transmissive area TA, the via insulating layer VIA may be disposed on the barrier layer BRR. That is, the via insulating layer VIA may be disposed in the non-transmissive area NTA and the transmissive area TA. However, embodiments according to the disclosure are not limited thereto, and the via insulating layer VIA may be disposed only in the non-transmissive area NTA. In addition, although the via insulating layer VIA is illustrated as a single layer in the drawings, the present disclosure is not limited thereto, and the via insulating layer VIA may have a multilayer structure.

The via insulating layer VIA may cover the source electrode SE and the drain electrode DE. The via insulating layer VIA may cover side surfaces of the low reflection layer LRL, the conductive layer CP, the buffer layer BFR, the gate insulating layer GI, and the interlayer insulating layer ILD. The via insulating layer VIA may have a flat upper surface. The via insulating layer VIA may include an organic insulating material. For example, examples of the organic insulating material forming the via insulating layer VIA may include acryl, benzocyclobutene (BCB), hexamethyldisiloxane (HMDSO), etc. The above materials may be used alone or in combination.

In the non-transmissive area NTA, the first electrode E1 may be disposed on the via insulating layer VIA. The first electrode E1 may be electrically connected to the drain electrode DE. For example, the first electrode E1 may contact one portion of the drain electrode DE through a contact hole penetrating the via insulating layer VIA. The first electrode E1 may include a conductive material. For example, examples of the conductive material forming the first electrode E1 may include indium tin oxide (ITO), indium zinc oxide (IZO), indium gallium oxide (IGO), Al-doped zinc oxide (AZO), indium gallium zinc oixde (IGZO), etc. The above materials may be used alone or in combination. Alternatively, the first electrode E1 may include the same material as the gate electrode GE.

In the non-transmissive area NTA, the pixel defining layer PDL may be disposed on the via insulating layer VIA. The pixel defining layer PDL may cover at least a portion of the first electrode E1. The pixel defining layer PDL may define an opening exposing at least a portion of the first electrode E1.

In the non-transmissive area NTA, the light emitting layer LL may be disposed on the first electrode E1. The light emitting layer LL may include a hole injection layer, a hole transport layer, an organic light emitting layer, an electron injection layer, and an electron transport layer. The light emitting layer LL may emit light. Alternatively, the light emitting layer LL may include an inorganic light emitting material. For example, the inorganic light emitting material may include gallium nitride (GaN).

In the non-transmissive area NTA, the second electrode E2 may be disposed on the pixel defining layer PDL. The second electrode E2 may be disposed to cover the light emitting layer LL. The second electrode E2 may include a metal having a relatively small work function. For example, examples of the material forming the second electrode E2 may include lithium, calcium, aluminum, silver, magnesium, etc. The above materials may be used alone or in combination.

In the non-transmissive area NTA, the active layer ACT, the gate electrode GE, the source electrode SE, and the drain electrode DE may define the transistor TR. In the non-transmissive area NTA, the first electrode E1, the light emitting layer LL, and the second electrode E2 may define the light emitting diode LD. The light emitting layer LL may be electrically connected to the transistor TR through the first electrode E1. Accordingly, the light emitting layer LL may receive an electrical signal from the transistor TR and emit light having a luminance corresponding to a magnitude of the electrical signal.

The transistor TR and the light emitting diode LD may overlap only the non-transmissive area NTA. The transistor TR and the light emitting diode LD may not overlap the transmissive area TA. Accordingly, the transmissive area TA may transmit light and the non-transmissive area NTA may emit light. As such, since the first area A1 includes the transmissive area TA and the non-transmissive area NTA, the first area A1 may have a relatively high transmittance compared to the second area A2.

In the non-transmissive area NTA and the transmissive area TA, the first inorganic encapsulation layer IL1 may be disposed. Specifically, in the non-transmissive area NTA, the first inorganic encapsulation layer IL1 may be disposed on the second electrode PE2. In the transmissive area TA, the first inorganic encapsulation layer IL1 may be disposed on the via insulating layer VIA. The first inorganic encapsulation layer IL1 may cover the pixel defining layer PDL and the second electrode PE2. Examples of the material forming the first inorganic encapsulation layer IL1 may include silicon oxide, silicon nitride, silicon oxynitride, etc. The above materials may be used alone or in combination.

In the non-transmissive area NTA and the transmissive area TA, the organic encapsulation layer OL may be disposed on the first inorganic encapsulation layer IL1. Since the first inorganic encapsulation layer IL1 is formed along a lower structure, an upper surface of the first inorganic encapsulation layer IL1 may not be flat. The organic encapsulation layer OL may have a relatively larger thickness than the first inorganic encapsulation layer ILL and may have a flat upper surface through a planarization process. Accordingly, the display device 10 may prevent a gap defect from occurring when components (e.g., a touch sensing layer, a cover window, etc.) disposed on the organic encapsulation layer OL are disposed. The organic encapsulation layer OL may have a substantially flat upper surface. Examples of the material forming the organic encapsulation layer OL may include polyethylene terephthalate, polyethylene naphthalate, polycarbonate, polyimide, polyethylene sulfonate, polyoxymethylene, polyarylate, hexamethyldisiloxane, acrylic resin, etc. The above materials may be used alone or in combination.

In the non-transmissive area NTA and the transmissive area TA, the second inorganic encapsulation layer IL2 may be disposed on the organic encapsulation layer OL. Examples of the material forming the second inorganic encapsulation layer IL2 may include silicon oxide, silicon nitride, silicon oxynitride, etc. The above materials may be used alone or in combination. The first inorganic encapsulation layer ILL the organic encapsulation layer OL, and the second inorganic encapsulation layer IL2 may prevent moisture, oxygen, etc from penetrating from the outside of the display device 10.

In the non-transmissive area NTA and the transmissive area TA, the first inorganic encapsulation layer ILL the organic encapsulation layer OL, and the second inorganic encapsulation layer IL2 may define the encapsulation layer EL. The encapsulation layer EL may overlap the non-transmissive area NTA and the transmissive area TA. That is, the encapsulation layer EL may extend from the non-transmissive area NTA to the transmissive area TA.

In the non-transmissive area NTA, the polarizing film POL may be disposed under the substrate SUB. A reflectance of the polarizing film POL may be less than a reflectance of the conductive layer CP. The polarizing film POL may prevent external light reflected by the functional module 200 from reaching the conductive layer CP. The polarizing film POL may be disposed to overlap an entirety of the conductive layer CP.

Light interference may occur when external light passes through the first area A1, and when the interfered external light is reflected by the display panel 100 and/or the functional module 200, the user may visually recognize a ghost image displayed on the first area A1. However, as the display device 10 according to an embodiment of the disclosure is disposed in the first area A1 and the low reflection layer LRL and the polarizing film POL overlap the conductive layer CP, even if the external light is reflected by the functional module 200, it is possible to prevent the external light from being reflected again by the conductive layer CP. That is, the low reflection layer LRL and the polarizing film POL may block the external light reaching the conductive layer CP. Accordingly, it is possible to prevent the user from recognizing the ghost image or the like.

Figure 5:
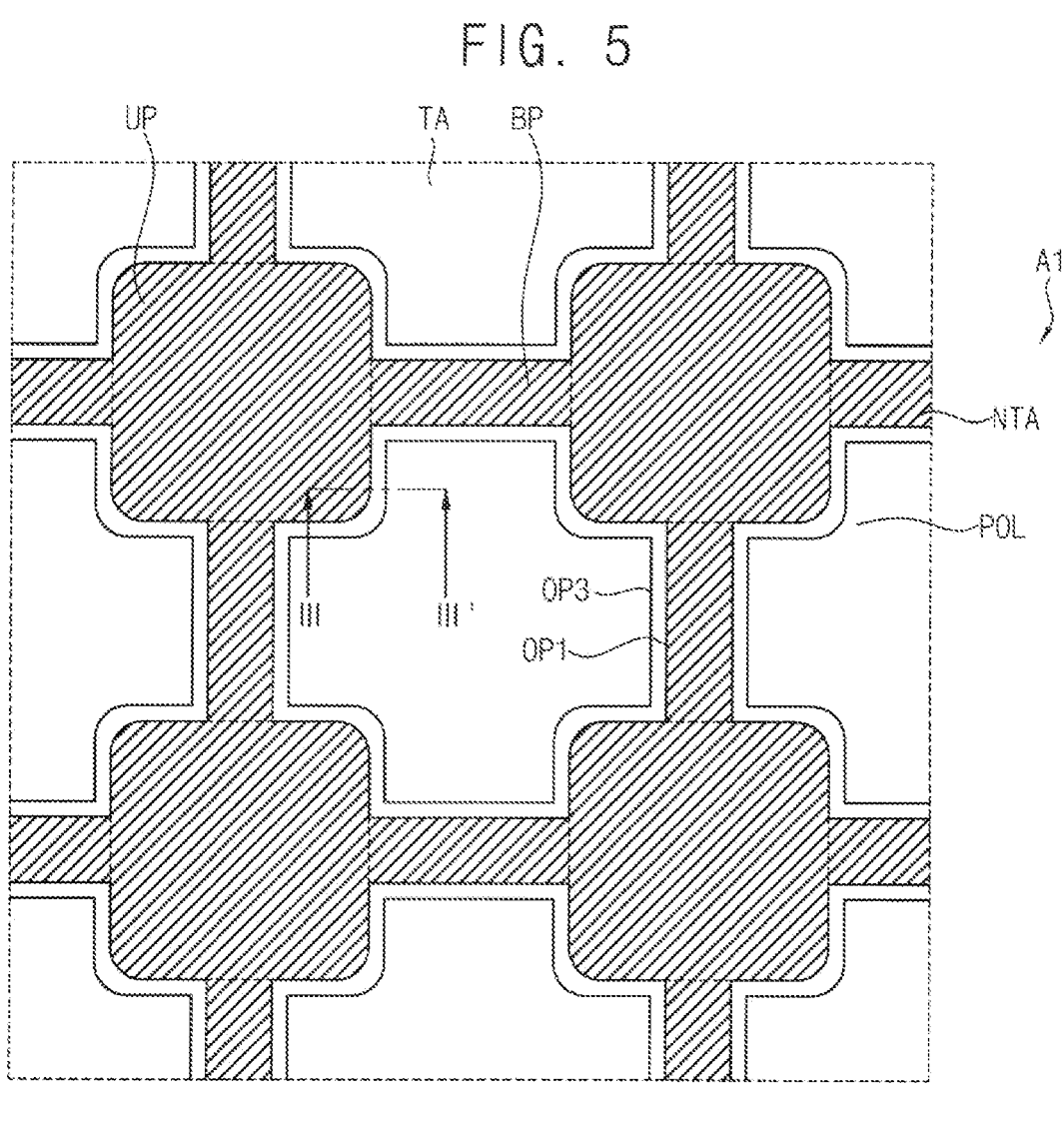
FIG. 5 is a plan view illustrating another example of FIG. 3.
Figure 6:
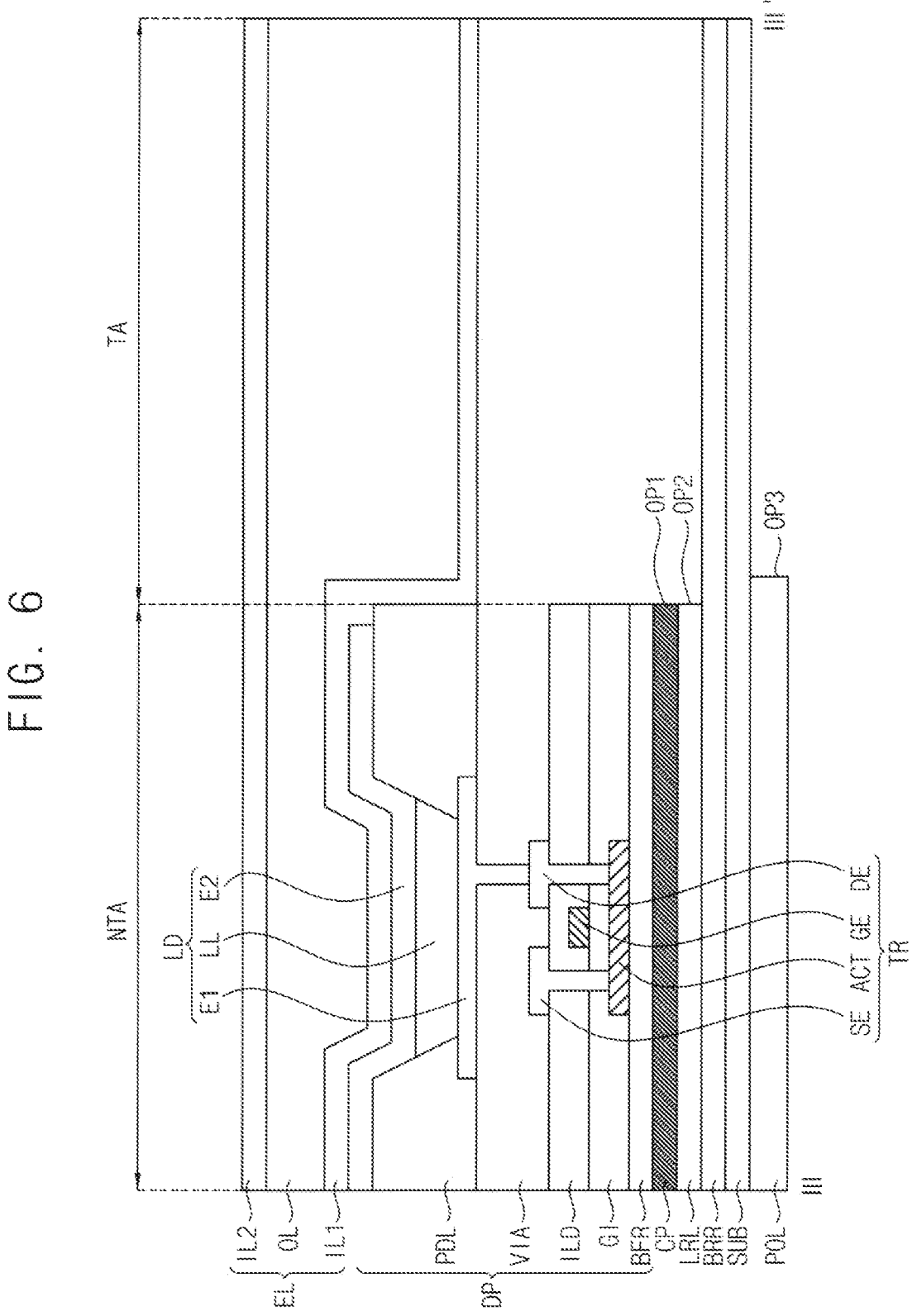
FIG. 6 is a cross-sectional view taken along line of FIG. 5.

FIG. 5 is a plan view illustrating another example of FIG. 3. FIG. 6 is a cross-sectional view taken along line of FIG. 5.

A display device illustrated in FIGS. 5 and 6 may be substantially the same as the display device described with reference to FIGS. 3 and 4 except for the polarizing film POL. Therefore, duplicated descriptions are omitted.

Referring to FIGS. 5 and 6, in an embodiment, a polarizing film POL may be disposed under a substrate SUB. The polarizing film POL may overlap the conductive layer CP. A shape of the polarizing film POL may be similar to that of the conductive layer CP. An area of the polarizing film POL may be larger than that of the conductive layer CP. The polarizing film POL may entirely overlap the conductive layer CP. Accordingly, the polarizing film POL may entirely overlap the non-transmissive area NTA. Also, the polarizing film POL may partially overlap the transmissive area TA.

The polarizing film POL may also include a plurality of unit patterns and a plurality of bridge patterns connecting the unit patterns. The third openings OP3 may be defined by the unit patterns and the bridge patterns included in the polarizing film POL. Each of the third openings OP3 may overlap each of the first openings OP1. In detail, each of the third openings OP3 may partially overlap each of the first openings OP1. For example, an area of the polarizing film POL may be larger than an area of the conductive layer CP. In this case, the area of each of the third openings OP3 may be less than that of each of the first openings OP1.

FIGS. 7, 8, 9, 10, 11, 12, and 13 are cross-sectional views illustrating a method of manufacturing a display device according to an embodiment. For example, FIGS. 7, 8, 9, 10, 11, 12, and 13 may be a method of manufacturing the display device according to FIGS. 1, 2, 3, and 4.

Figure 7:
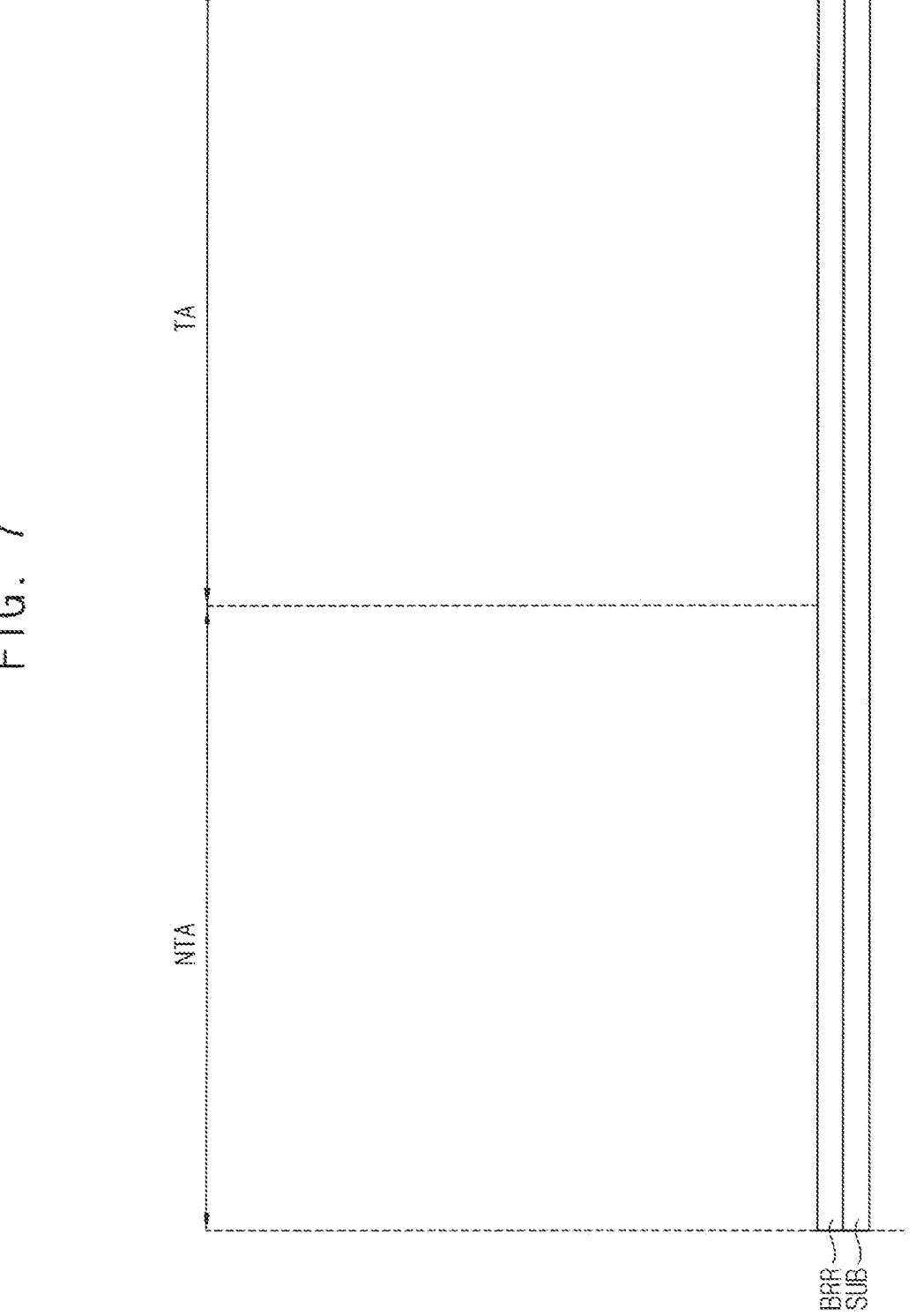

Referring to FIGS. 1 and 7, a substrate SUB may be provided. The substrate SUB may include a first area A1 and a second area A2. The first area A1 may include a transmissive area TA and a non-transmissive area NTA adjacent to the transmissive area TA. A barrier layer BRR may be formed on the substrate SUB in the transmissive area TA and the non-transmissive area NTA.

Figure 8:
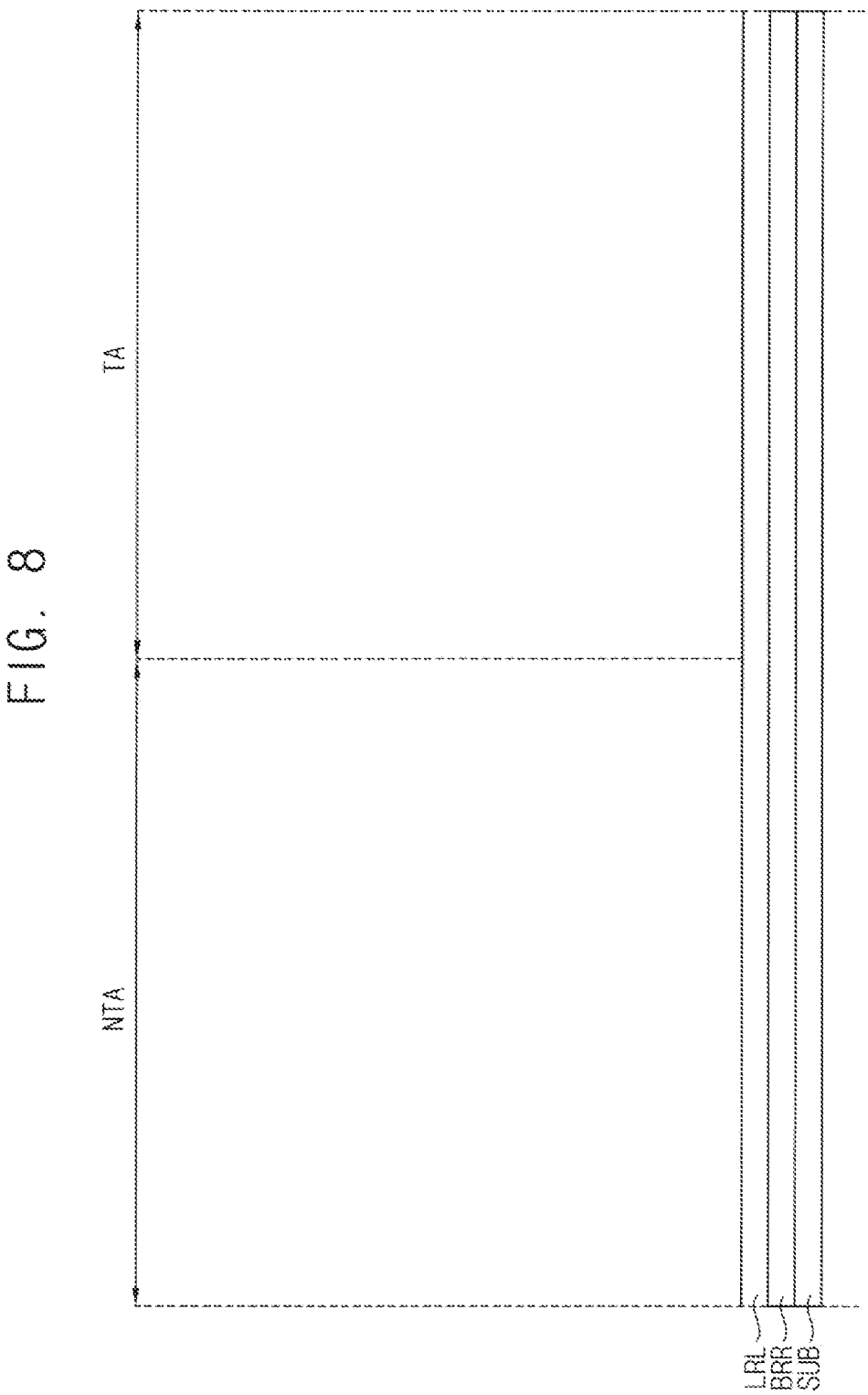
Figure 9:
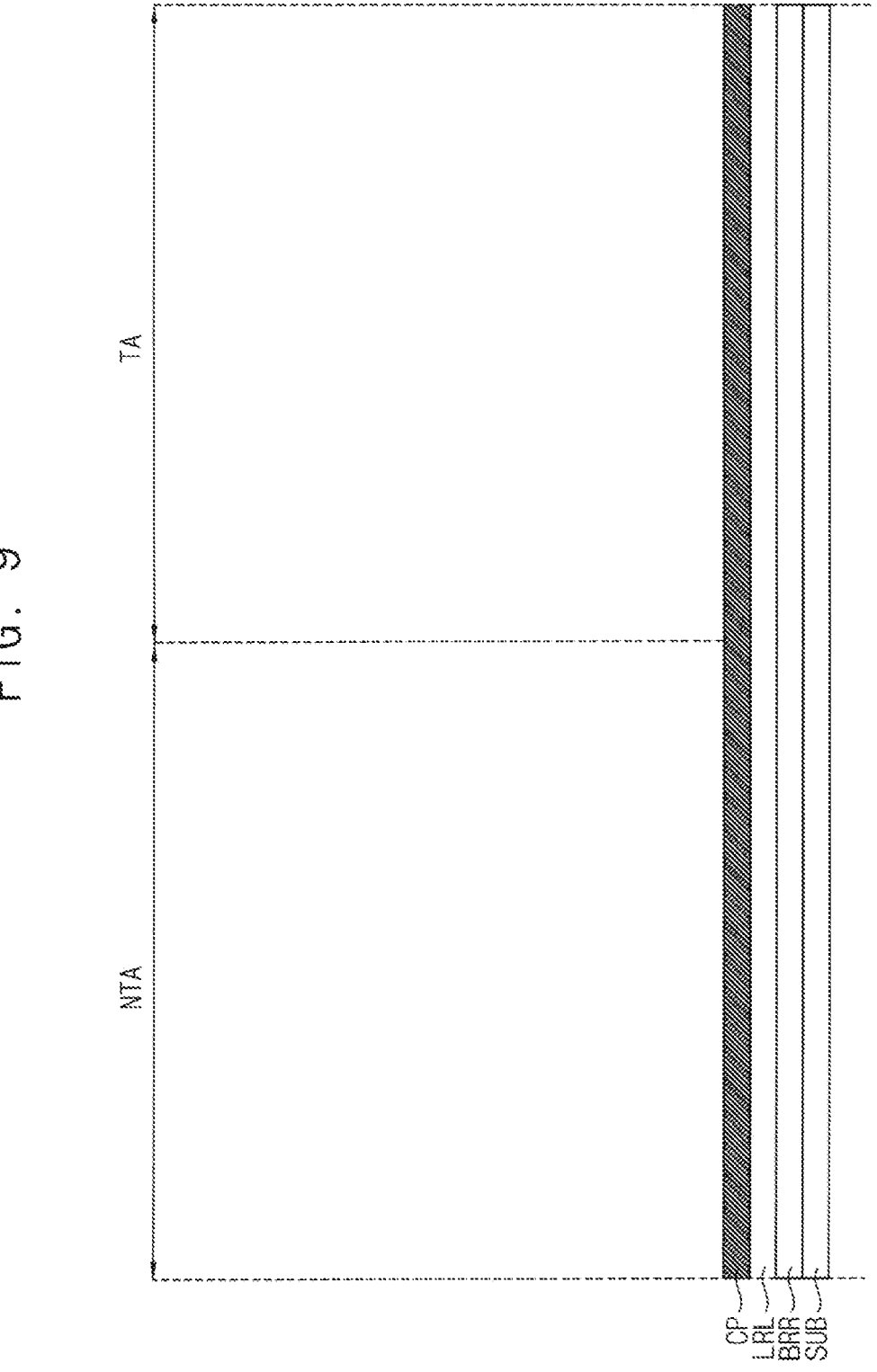

Referring to FIGS. 8 and 9, in the transmissive area TA and the non-transmissive area NTA, a low reflection layer LRL may be formed on the barrier layer BRR, and the conductive layer CP may be formed on the low reflection layer LRL. The low reflection layer LRL may be formed of amorphous silicon, silicon oxide, or a mixture thereof. The conductive layer CP may be formed of molybdenum.

Figure 10:
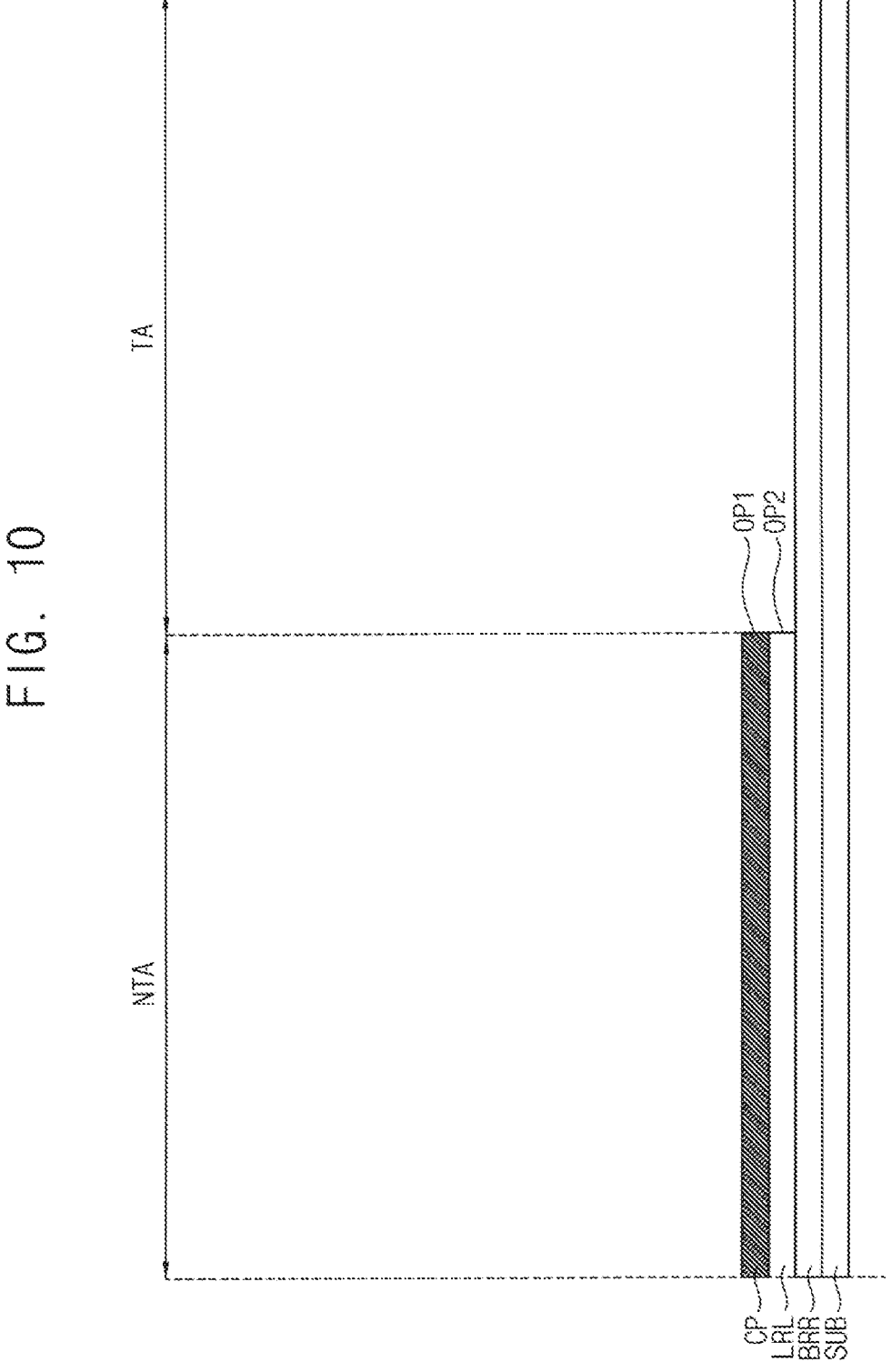

Referring to FIG. 10, in an embodiment, the conductive layer CP and the low reflection layer LRL may be simultaneously patterned. A portion of the conductive layer CP and the low reflection layer LRL that overlaps the transmissive area TA may be removed. Accordingly, first openings OP1, a plurality of first unit patterns (e.g., the unit patterns UP of FIG. 3) arranged in a matrix form, and a plurality of first bridge patterns (e.g., the bridge patterns BP of FIG. 3) connecting the first unit patterns may be formed in the conductive layer CP. Each of the first openings OP1 may be defined by the first unit patterns and the first bridge patterns.

Similarly, second openings OP2, a plurality of second unit patterns arranged in a matrix form, and a plurality of second bridge patterns connecting the second unit patterns may be formed in the low reflection layer LRL. Each of the second openings OP2 may be defined by the second unit patterns and the second bridge patterns.

In an embodiment, the first openings OP1 and the second openings OP2 may be formed simultaneously, and the first openings OP1 and the second openings OP2 may entirely overlap each other. Also, each of the first openings OP1 and each of the second openings OP2 may have the same shape and area. As the conductive layer CP and the low reflection layer LRL are simultaneously patterned, a manufacturing process may be simplified.

Figure 11:
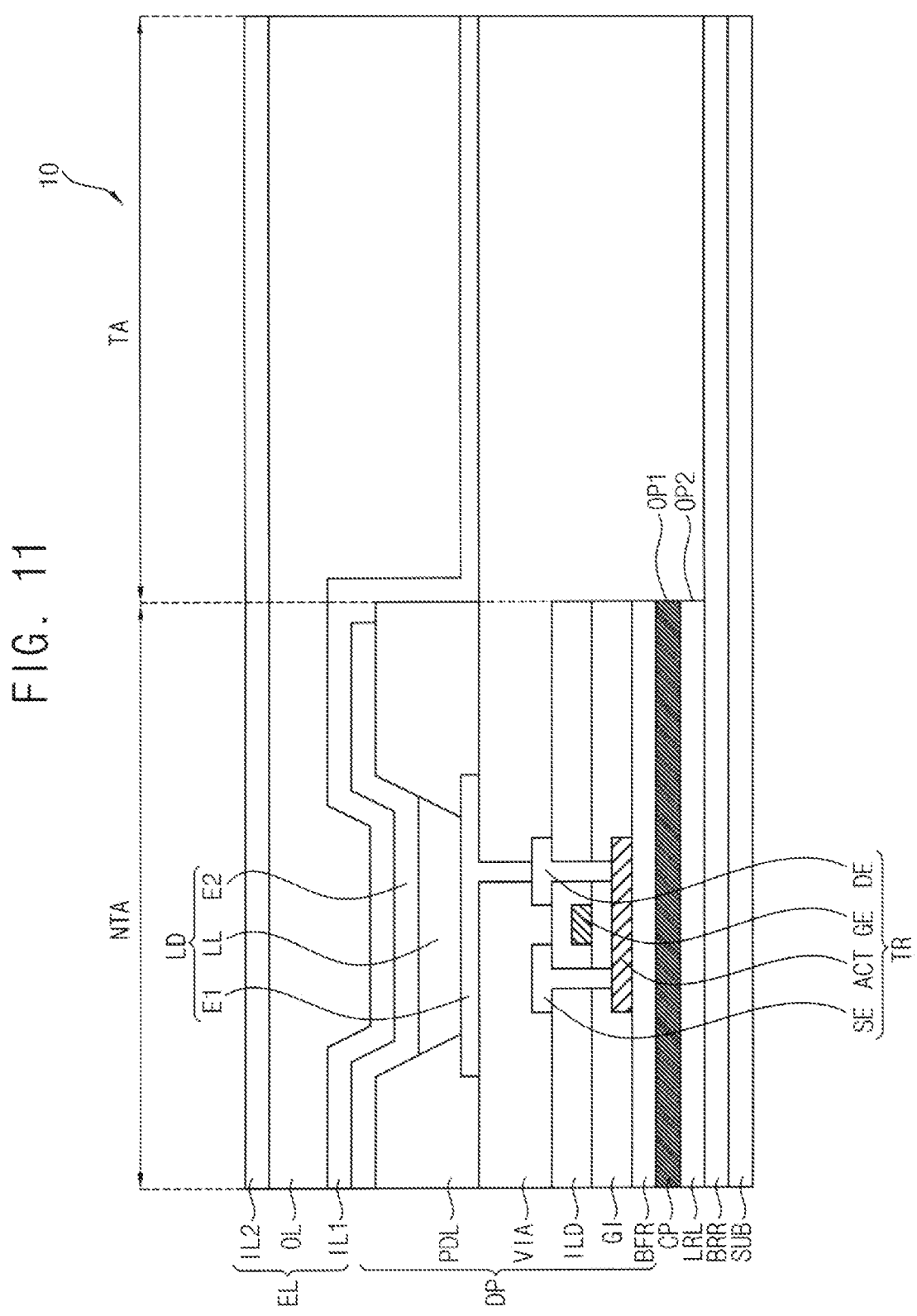

Referring to FIG. 11, in the non-transmissive area NTA, a display portion DP may be formed on the conductive layer CP. The display portion DP may include a buffer layer BFR, a gate insulating layer GI, an active layer ACT, a source electrode SE, a drain electrode DE, a gate electrode GE, an interlayer insulating layer ILD, and a via insulating layer VIA, a pixel defining layer PDL, and a light emitting diode LD. That is, the buffer layer BFR, the gate insulating layer GI, the active layer ACT, the source electrode SE, the drain electrode DE, the gate electrode GE, the interlayer insulating layer ILD, the via insulating layer VIA, the pixel defining layer PDL, and the light emitting diode LD may be sequentially formed on the conductive layer CP. The light emitting diode LD may include a first electrode E1, a light emitting layer LL, and a second electrode E2. Thereafter, in the non-transmissive area NTA and the transmissive area TA, the encapsulation layer EL may be formed on the display portion DP. The encapsulation layer EL may include a first inorganic encapsulation layer ILL an organic encapsulation layer OL, and a second inorganic encapsulation layer IL2.

Figure 12:
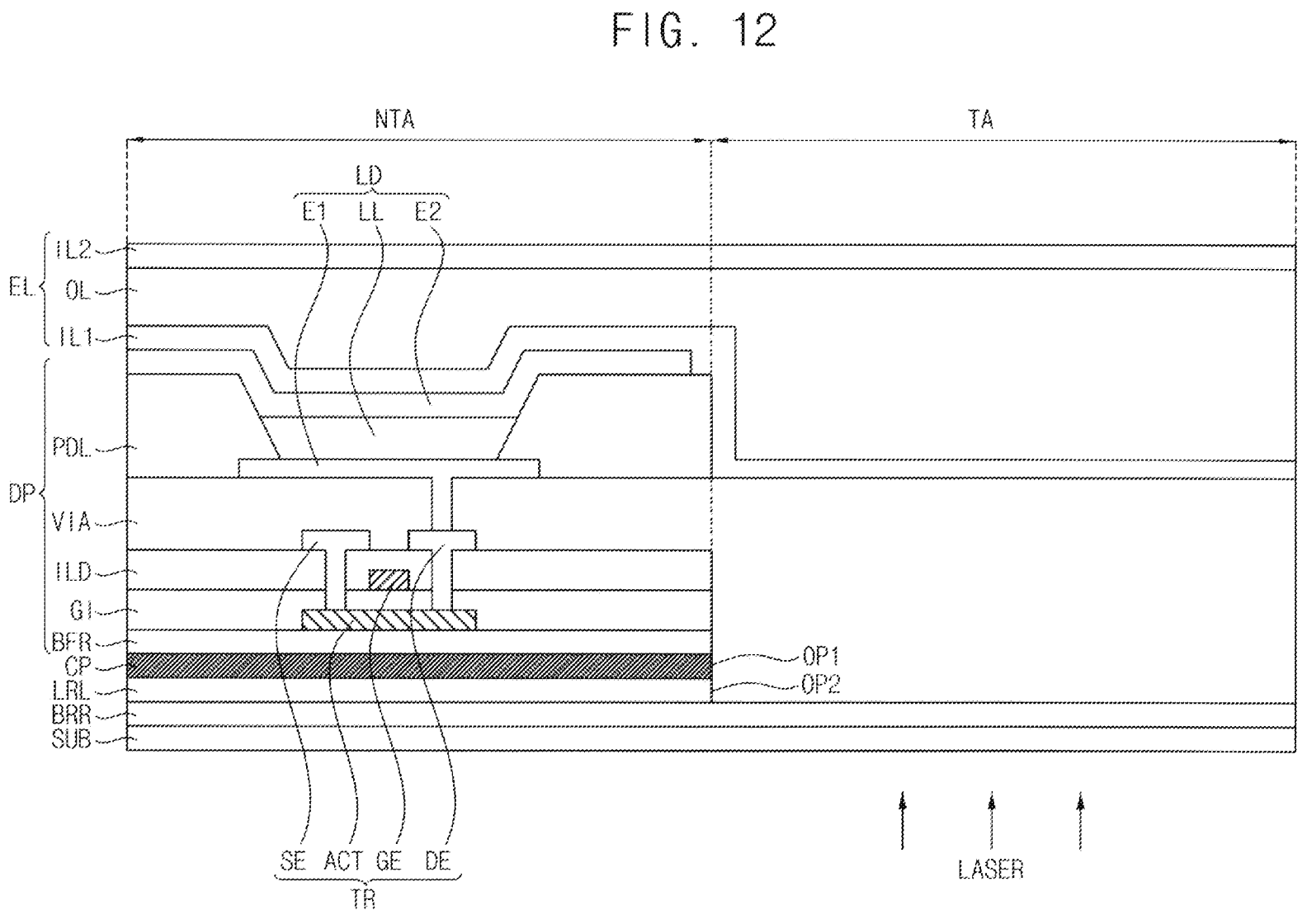
Figure 13:
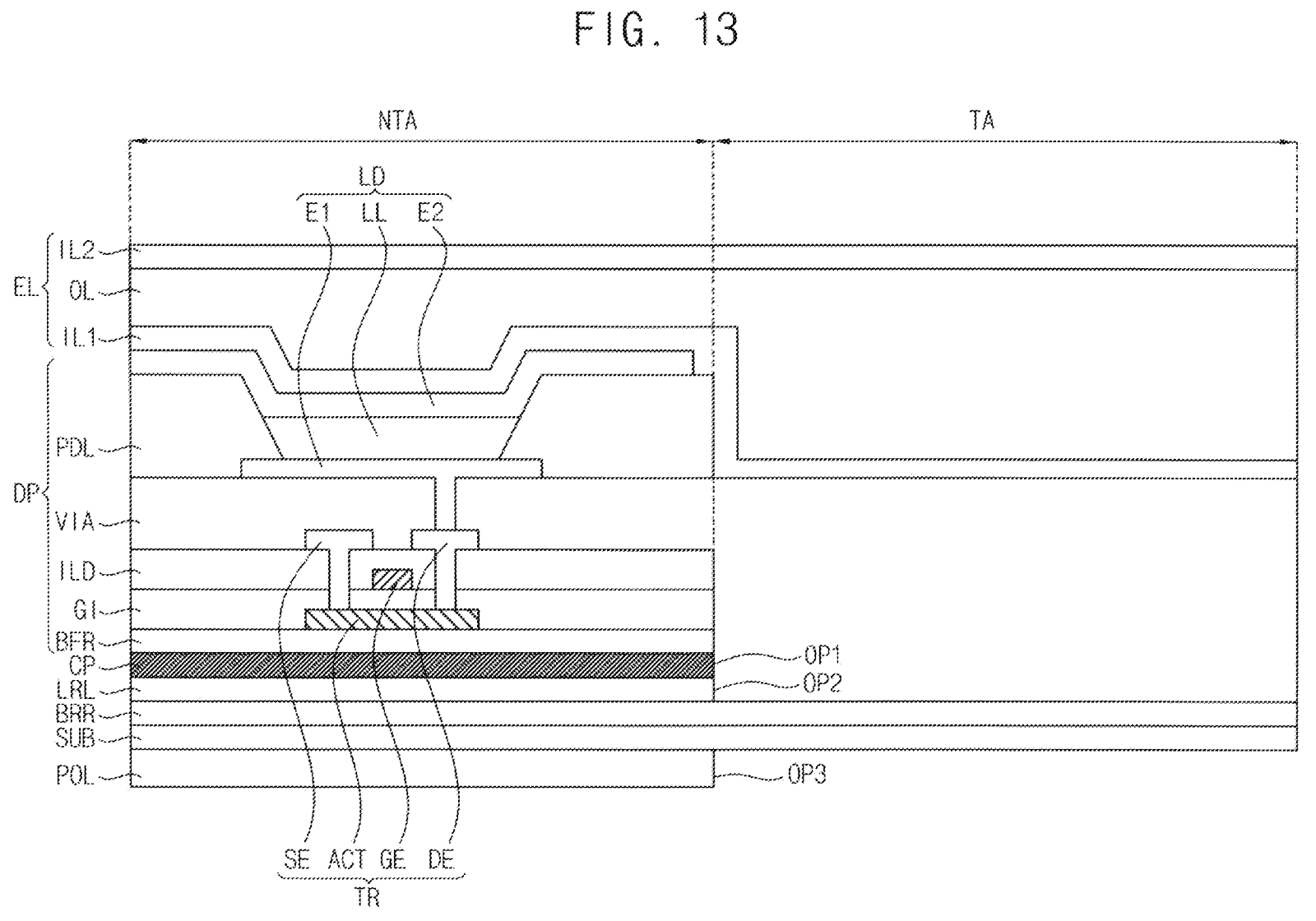

Referring to FIGS. 12 and 13, in the transmissive area TA and the non-transmissive area NTA, a polarizing film POL may be formed under the substrate SUB. In an embodiment, the polarizing film POL may be patterned by irradiating a laser to the polarizing film POL. A portion of the polarizing film POL which does not overlap the conductive layer CP may be removed. That is, a portion of the polarizing film POL overlapping the non-transmissive area NTA may remain. Accordingly, third openings OP3, a plurality of third unit patterns arranged in a matrix form, and a plurality of third bridge patterns connecting the third unit patterns may be formed in the polarizing film POL. Each of the third openings OP3 may be defined by the third unit patterns and the third bridge patterns.

Each of the third openings OP3 may overlap each of the first openings OP1, and the polarizing film POL may entirely overlap the conductive layer CP. Each of the third openings OP3 may have the same shape as each of the first openings OP1 (e.g., the third openings OP3 of FIGS. 3 and 4) or similar to each of the first openings OP1 (e.g., the third openings OP3 of FIGS. 5 and 6). An area of each of the third openings OP3 may be equal to an area of each of the first openings OP1 (e.g., the third openings OP3 of FIGS. 3 and 4), or may be less than the area of each of the first openings OP1 (e.g., the third openings OP3 of FIGS. 5 and 6).

The display device and the method of manufacturing the display device according to the embodiments may be applied to a display device included in a computer, a notebook, a mobile phone, a smartphone, a smart pad, a PMP, a PDA, an MP3 player, or the like.

Although the display device and the method according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
   a substrate including a first area and a second area, wherein the first area includes a transmissive area and a non-transmissive area disposed adjacent to the transmissive area, and the second area has transmittance less than the first area;
   a display portion disposed in the non-transmissive area of the first area and the second area and disposed on the substrate;
   a conductive layer disposed between the substrate and the display portion and defining a plurality of first openings overlapping the transmissive area;
   a low reflection layer disposed between the substrate and the conductive layer, overlapping the conductive layer, and defining a plurality of second openings overlapping the transmissive area and
   a polarizing film disposed under the substrate, overlapping the conductive layer, and defining a plurality of third openings overlapping the transmissive area,
   wherein the display portion includes a pixel which emits light,
   the first openings, the second openings, and the third openings are spaced apart from the pixel, in a plan view, and
   an area of each of the third openings is less than an area of each of the first openings, in a plan view.

2. The display device of claim 1, wherein in a plan view, each of the first openings and each of the second openings overlap each other, and
   each of the first openings and each of the third openings overlap each other.

3. The display device of claim 1, wherein each of the first openings and each of the second openings have a same shape.

4. The display device of claim 1, wherein the conductive layer includes a plurality of unit patterns arranged in a matrix form and a plurality of bridge patterns connecting the unit patterns.

5. The display device of claim 4, wherein each of the first openings is defined by the unit patterns and the bridge patterns.

6. The display device of claim 1, wherein the low reflection layer includes amorphous silicon, silicon oxide, or a mixture thereof.

7. The display device of claim 1, wherein a reflectance of the polarizing film is less than a reflectance of the conductive layer.

8. The display device of claim 1, further comprising:
a functional module disposed under the substrate and the polarizing film and overlapping the first area.

9. The display device of claim 1, wherein the display portion includes a transistor disposed on the conductive layer and a light emitting diode electrically connected to the transistor.

10. The display device of claim 9, wherein the transistor and the light emitting diode overlap the non-transmissive area of the first area and the second area and do not overlap the transmissive area.

11. A display device comprising:
a substrate including a first area and a second area, wherein the first area includes a transmissive area and a non-transmissive area disposed adjacent to the transmissive area and the second area has a transmittance less than a transmittance of the first area;
a display portion disposed in the non-transmissive area of the first area and the second area and disposed on the substrate;
a conductive layer disposed between the substrate and the display portion, overlapping the non-transmissive area of the first area and the second area, and defining a plurality of first openings overlapping the transmissive area;
a low reflection layer disposed between the substrate and the conductive layer, overlapping the conductive layer, and defining a plurality of second openings, wherein each of the second openings overlaps each of the first openings and has the same shape as each of the first openings; and
a polarizing film disposed under the substrate, overlapping the conductive layer, and defining a plurality of third openings, wherein each of the third openings overlaps each of the first openings and has an area less than an area of each of the first openings,
wherein the display portion includes a pixel which emits light, and the first openings, the second openings, and the third openings are spaced apart from the pixel, in a plan view.

12. The display device of claim 11, wherein the conductive layer includes a plurality of unit patterns arranged in a matrix form and a plurality of bridge patterns connected the unit patterns.

13. The display device of claim 12, wherein each of the first openings is defined by the unit patterns and the bridge patterns.

14. A method of manufacturing a display device, the method comprising steps of:
forming a low reflection layer on a substrate, wherein the substrate includes a first area including a transmissive area and a non-transmissive area disposed adjacent to the transmissive area, and a second area having transmittance less than transmittance of the first area;
forming a conductive layer on the low reflection layer;
forming a plurality of first openings by patterning a portion of the conductive layer overlapping the transmissive area;
forming a plurality of second openings by patterning a portion of the low reflection layer overlapping the transmissive area;
forming a display portion on the conductive layer;
forming a polarizing film under the substrate; and
forming a plurality of third openings in the polarizing film, wherein each of the third openings overlaps each of the first openings,
wherein the display portion includes a pixel which emits light,
the first openings, the second openings, and the third openings are spaced apart from the pixel, in a plan view,
and an area of each of the third openings is less than an area of each of the first openings, in a plan view.

15. The method of claim 14, wherein the polarizing film overlaps the conductive layer.

16. The method of claim 14, wherein the first openings and the second openings are formed simultaneously.

17. The method of claim 14, wherein each of the first openings and each of the second openings have a same shape.

18. The method of claim 14, wherein the third openings are formed by irradiating a laser to the polarizing film.

* * * * *